(12) United States Patent
Kuo et al.

(10) Patent No.: US 9,659,874 B2
(45) Date of Patent: May 23, 2017

(54) METHOD OF FORMING DEEP TRENCH AND DEEP TRENCH ISOLATION STRUCTURE

(71) Applicant: TAIWAN SEMICONDUCTOR MANUFACTURING CO., LTD., Hsinchu (TW)

(72) Inventors: Fu-Chiang Kuo, Hsinchu (TW); Ying-Hsun Chen, Taoyuan (TW); Shih-Chi Kuo, Taoyuan (TW); Tsung-Hsien Lee, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/883,545

(22) Filed: Oct. 14, 2015

(65) Prior Publication Data

US 2017/0110409 A1    Apr. 20, 2017

(51) Int. Cl.
*H01L 29/06*    (2006.01)
*H01L 23/544*   (2006.01)
*H01L 21/308*   (2006.01)
*H01L 21/306*   (2006.01)

(52) U.S. Cl.
CPC ........ *H01L 23/544* (2013.01); *H01L 21/3081* (2013.01); *H01L 21/3085* (2013.01); *H01L 21/30604* (2013.01)

(58) Field of Classification Search
CPC ... H01L 2223/5446; H01L 2223/54453; H01L 21/78–21/86; H01L 21/3081–21/3085; H01L 21/76813
See application file for complete search history.

(56) References Cited

U.S. PATENT DOCUMENTS

| | | | | |
|---|---|---|---|---|
| 8,614,145 | B2* | 12/2013 | Hummler | H01L 21/76898 257/621 |
| 2002/0041028 | A1* | 4/2002 | Choi | H01L 21/2855 257/751 |
| 2003/0219973 | A1* | 11/2003 | Townsend, III | H01L 21/0271 438/631 |
| 2004/0036076 | A1* | 2/2004 | Arita | H01L 21/76808 257/79 |
| 2005/0196952 | A1* | 9/2005 | Genz | H01L 21/76811 438/622 |
| 2005/0236181 | A1* | 10/2005 | Chen | H01L 21/76807 174/256 |

(Continued)

*Primary Examiner* — Reema Patel
*Assistant Examiner* — Syed Gheyas
(74) *Attorney, Agent, or Firm* — Maschoff Brennan

(57) ABSTRACT

A method of forming a deep trench in a semiconductor substrate includes: forming a first mask pattern over the semiconductor substrate, in which the first mask pattern has a first opening exposing a portion of the semiconductor substrate; forming a second mask pattern over the first mask pattern, in which the second mask pattern has a second opening substantially aligned with the first opening to expose the portion of the semiconductor substrate, and the second opening has a width greater than a width of the first opening to further expose a portion of the first mask pattern; and removing the portion of the semiconductor substrate, the portion of first mask pattern and another portion of the semiconductor substrate beneath the portion of the first mask pattern to form the deep trench.

20 Claims, 5 Drawing Sheets

(56) References Cited

U.S. PATENT DOCUMENTS

2009/0286384 A1\* 11/2009 Wu .................. H01L 21/76229
                                                               438/584
2013/0337633 A1\* 12/2013 Seddon .................. H01L 21/78
                                                               438/462

\* cited by examiner

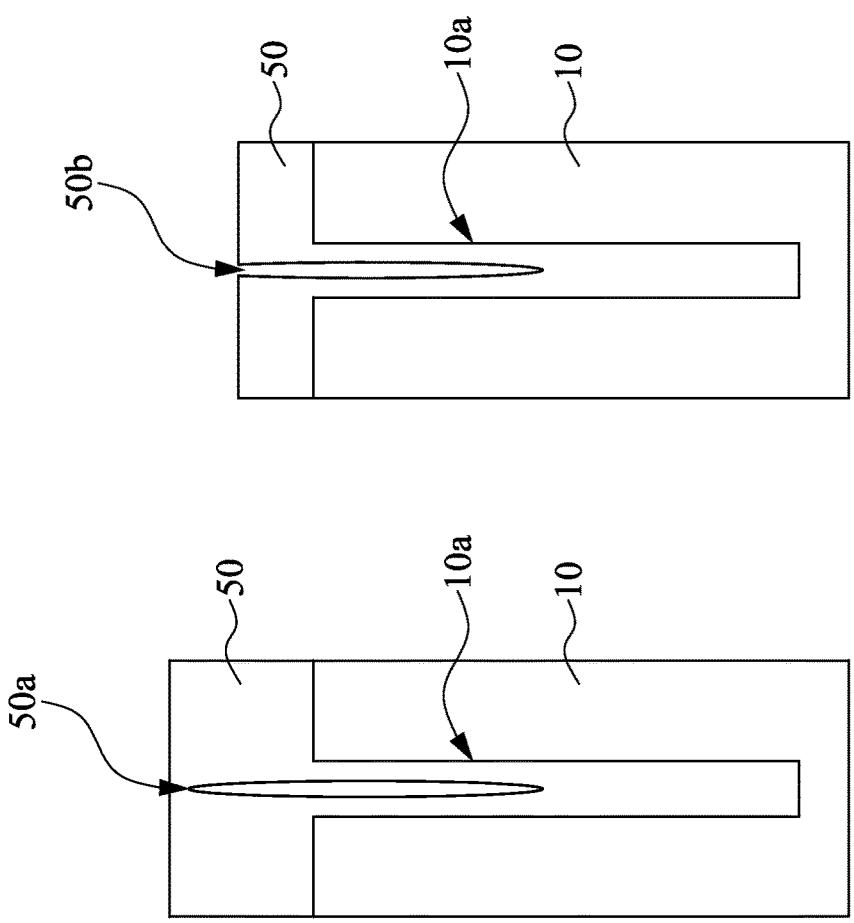

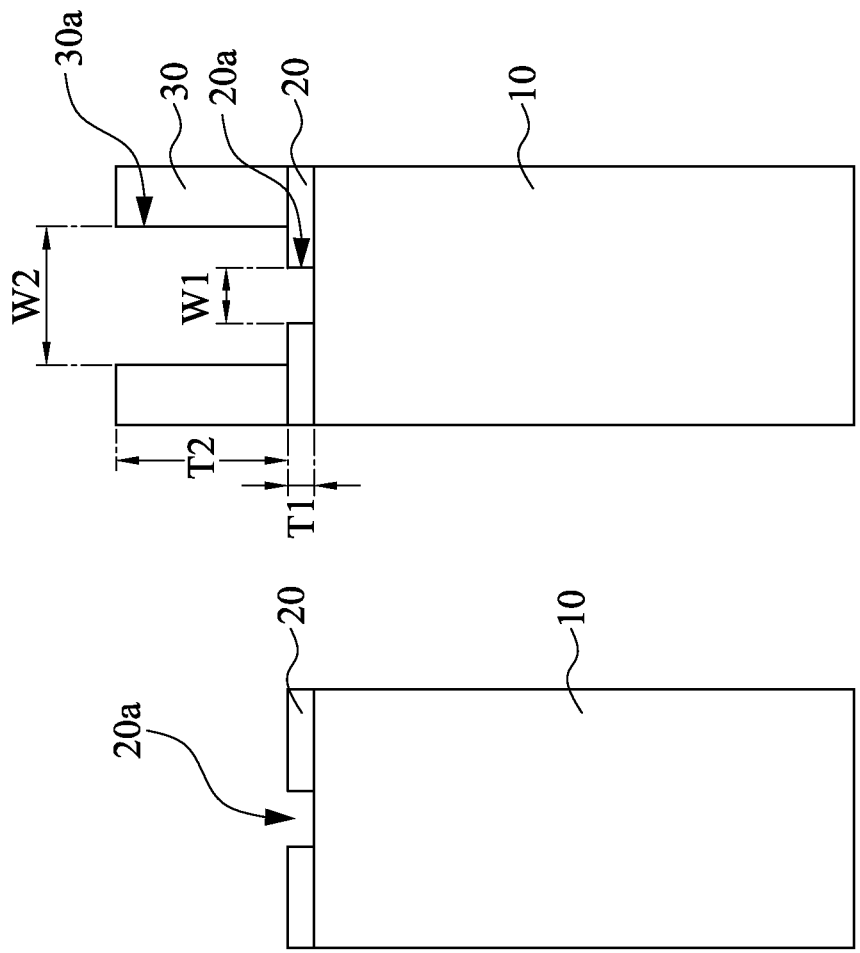

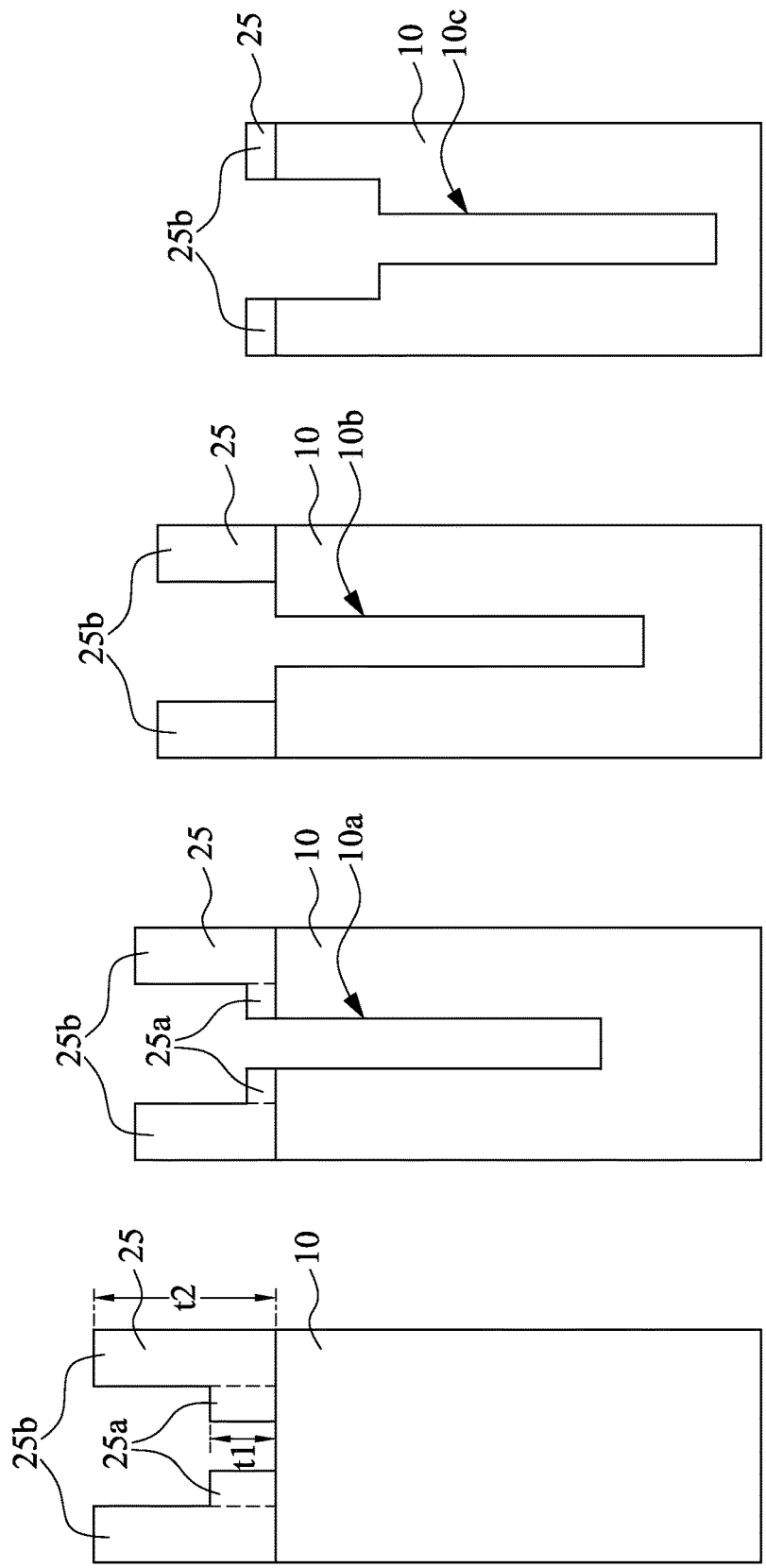

METHOD OF FORMING DEEP TRENCH AND DEEP TRENCH ISOLATION STRUCTURE

BACKGROUND

In the past, the semiconductor industry utilized various methods and equipment to singulate individual semiconductor chip from a semiconductor wafer on which the chip was manufactured. Typically, a technique called scribing or dicing was used to either partially or fully cut through the wafer with a diamond-cutting wheel along scribe lines that were formed on the wafer between the individual chip.

Unfortunately, the scribe line with greater width is not suitable for separating the semiconductor chips with smaller size. Improvements continue to be sought for separating semiconductor chips with smaller size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a cross-sectional view of a deep trench isolation structure.

FIG. 1B is a cross-sectional view at a stage subsequent to the stage of FIG. 1A.

FIGS. 2A to 2E are cross-sectional views at various stages of forming a deep trench in a semiconductor substrate in accordance with some embodiments of the present disclosure.

FIGS. 3A to 3D are cross-sectional views at various stages of forming a deep trench in a semiconductor substrate in accordance with some embodiments of the present disclosure.

DETAILED DESCRIPTION

Figure 2F:
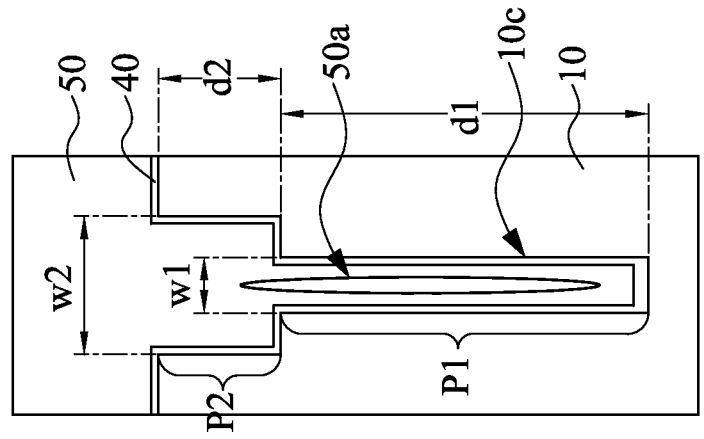
FIGS. 2F to 2I are cross-sectional views at various stages subsequent to the stage of FIG. 2E in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As mentioned above, improvements continue to be sought for separating semiconductor chips with smaller size. For example, a deep trench isolation structure can be used to separate semiconductor chips with smaller size. However, the deep trench isolation structure may have a void in the deep trench during the process of forming an isolation material therein. The void may affect process yield of the semiconductor chip. For instance, as shown in FIG. 1A, a deep trench 10a is firstly formed in a substrate 10. Next, an isolation material 50 is formed in the deep trench 10a, and a void 50a is formed in the isolation material 50. The void 50a may have a portion higher than an upper surface of the substrate 10, which is not conducive to subsequent processes. For instance, as shown in FIGS. 1A and 1B, after a planarization process is performed on the isolation material 50, a slit 50b is formed. A material (not shown) subsequently formed, such as adhesive (e.g., for adhesion of a printed circuit board (PCB)) or photoresist, is not only on a flat upper surface of the isolation material 50 but also in the slit 50b. The material in the slit 50b will cause process problems. For example, the adhesive in the slit 50b will result in failure of separation of the semiconductor chips. It is also found that a void with a portion higher than an upper surface of the substrate will be formed in an isolation material, even though the deep trench 10a of FIG. 1A becomes narrower.

Accordingly, the present disclosure provides a method of forming a deep trench having a wider upper portion to prevent forming a void in a filling material higher than an upper surface of a substrate. FIGS. 2A to 2E are cross-sectional views at various stages of forming a deep trench 10c in a semiconductor substrate 10 in accordance with some embodiments of the present disclosure.

Referring to FIG. 2A, the semiconductor substrate 10 is provided. In some embodiments, the semiconductor substrate 10 includes semiconductor chips. In some embodiments, the semiconductor substrate 10 includes complementary metal oxide semiconductor (CMOS) integrated circuits (ICs), micro-electromechanical systems (MEMS), any other suitable electronic component or a combination thereof. In some embodiments, the semiconductor substrate 10 is a CMOS substrate. In some embodiments, the semiconductor substrate 10 includes an epitaxy layer (not shown) therein. In some embodiments, the electronic components are disposed over the epitaxy layer. In some embodiments, the semiconductor substrate 10 includes a pass layer (not shown) over the semiconductor substrate 10. In some embodiments, the pass layer includes insulating material, such as silicon oxide, silicon nitride, silicon oxynitride or a combination thereof. In some embodiments, the semiconductor substrate 10 includes an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or a combination thereof. In some embodiments, the semiconductor substrate 10 is a bulk silicon substrate.

As shown in FIG. 2A, a first mask pattern 20 is formed over the semiconductor substrate 10. The first mask pattern 20 has a first opening 20a exposing a portion of the semiconductor substrate 10. In some embodiments, the first mask pattern 20 is formed using photolithographic processes. In some embodiments, the first mask pattern 20 is formed by depositing a mask material (not shown), forming a photoresist (not shown) over the mask material and patterning (or etching) the mask material according to the photoresist. In some embodiments, the mask material is deposited using chemical vapor deposition (CVD) (e.g., plasma-enhanced CVD (PECVD)), ion beam deposition (IBD), sputtering method or any other suitable deposition method. In some embodiments, the first mask pattern 20 includes a hard mask material. In some embodiments, the first mask pattern 20 includes an inorganic material. In some embodiments, the first mask pattern 20 includes silicon oxide, silicon nitride, silicon oxynitride or a combination thereof. In some embodiments, the first mask pattern 20 includes a silicon-containing organic material.

Referring to FIG. 2B, a second mask pattern 30 is formed over the first mask pattern 10. The second mask pattern 30 has a second opening 30a substantially aligned with the first opening 20a to expose the portion of the semiconductor substrate 10. The term "substantially aligned with" means that a vertical projection of the second opening 30a on the semiconductor substrate 10 is overlapped with a vertical projection of the first opening 20a on the semiconductor substrate 10. In some embodiments, the vertical projection of the first opening 20a on the semiconductor substrate 10 is in the vertical projection of the second opening 30a on the semiconductor substrate 10.

The second opening 30a has a width W2 greater than a width W1 of the first opening 20a to further expose a portion of the first mask pattern 10. The wider width W2 of the second opening 30a is configured to form a wider upper portion of the deep trench. In some embodiments, the width W2 of the second opening 30a is greater than or equal to twice the width W1 of the first opening 20a.

In some embodiments, the second mask pattern 30 is formed using photolithographic processes. In some embodiments, the second mask pattern 30 is formed by forming a mask material (not shown) and performing the photolithographic processes on the mask material. In some embodiments, the second mask pattern 30 includes an organic material. In some embodiments, the second mask pattern 30 is formed by depositing a mask material (not shown), forming a photoresist (not shown) over the mask material and patterning (or etching) the mask material according to the photoresist. In some embodiments, the second mask pattern 30 includes an inorganic material. In some embodiments, the second mask pattern 30 has a thickness T2 greater than a thickness T1 of the first mask pattern 20.

Figure 2E:
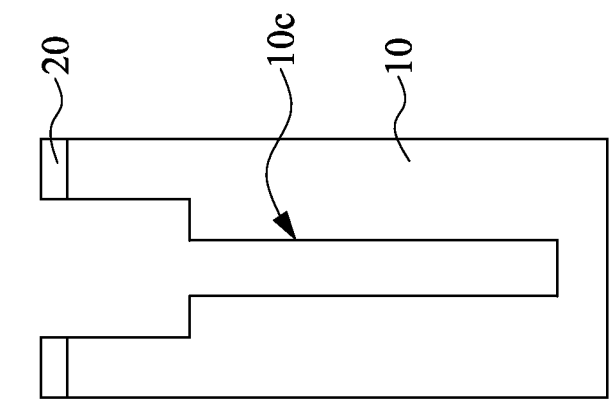
Figure 2D:
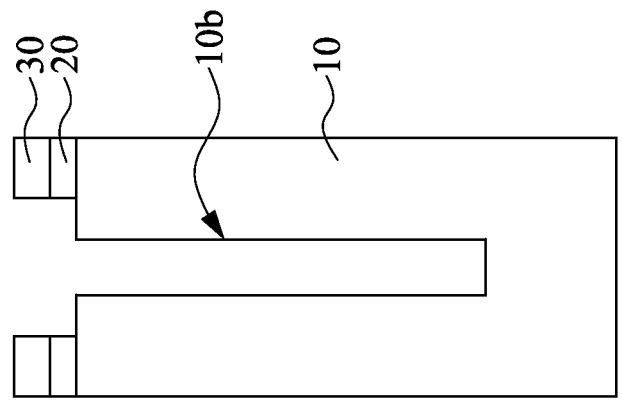

Referring to FIGS. 2B to 2E, the exposed portion of the semiconductor substrate 10 of FIG. 2B, the exposed portion of first mask pattern 20 of FIG. 2C and another portion of the semiconductor substrate 10 beneath the exposed portion of the first mask pattern 20 of FIG. 2D are sequentially removed to form the deep trench 10c of FIG. 2E.

Specifically, in some embodiments, as shown in FIGS. 2B and 2C, the exposed portion of the semiconductor substrate 10 is removed according to the first mask pattern 20 to form a trench 10a. In some embodiments, the second mask pattern 30 is thinned during removing the portion of the semiconductor substrate 10. In some embodiments, the exposed portion of the semiconductor substrate 10 is removed using a dry etching method. In some embodiments, an etching gas of the dry etching method includes $C_xF_yH_z$. In some embodiments, the etching gas of the dry etching method includes $C_4F_6$, $C_4F_8$, $C_5F_8$, $C_2F_4H_2$, $CF_3H$, $CF_2H_2$, any other suitable $C_xF_yH_z$ gas or a combination thereof.

In some embodiments, as shown in FIGS. 2C and 2D, the exposed portion of the first mask pattern 20 of FIG. 2C is removed according to the second mask pattern 30 to expose the other portion of the semiconductor substrate 10 and remain another portion of the first mask pattern 20. In some embodiments, the trench 10a of FIG. 2C is etched when the portion of first mask pattern 20 is removed, and thus to form a trench 10b with a depth greater than that of the trench 10a. In some embodiments, the exposed portion of the first mask pattern 20 is removed or the trench 10a is etched using a dry etching method. In some embodiments, an etching gas of the dry etching method includes $C_xF_yH_z$. In some embodiments, the etching gas of the dry etching method includes $C_4F_6$, $C_4F_8$, $C_5F_8$, $C_2F_4H_2$, $CF_3H$, $CF_2H_2$, any other suitable $C_xF_yH_z$ gas or a combination thereof.

In some embodiments, as shown in FIGS. 2D and 2E, the other portion of the semiconductor substrate 10 of FIG. 2D is removed and the trench 10b is etched according to the other portion of the first mask pattern 20 to form the deep trench 10c. In some embodiments, the deep trench 10c has a depth greater than that of the trench 10b. In some embodiments, the other portion of the semiconductor substrate 10 is removed or the trench 10b is etched using a dry etching method. In some embodiments, an etching gas of the dry etching method includes $C_xF_yH_z$. In some embodiments, the etching gas of the dry etching method includes $C_4F_6$, $C_4F_8$, $C_5F_8$, $C_2F_4H_2$, $CF_3H$, $CF_2H_2$, any other suitable $C_xF_yH_z$ gas or a combination thereof.

FIGS. 2F to 2I are cross-sectional views at various stages subsequent to the stage of FIG. 2E in accordance with some embodiments of the present disclosure.

Referring to FIGS. 2E and 2F, the first mask pattern 20 is removed. In some embodiments, the first mask pattern 20 is removed using wet etching, dry etching or any other suitable removal method. In some embodiments, the first mask pattern 20 is removed using wet etching with a suitable agent, such as ammonium, hydrogen peroxide, hydrofluoric acid, phosphoric acid or a combination thereof. In some embodiments, the first mask pattern 20 is removed using dry etching, such as reactive ion etch (RIE), any other suitable dry etching method or a combination thereof.

After the first mask pattern 20 is removed, a filling material 50 is formed in the deep trench 10c. In some embodiments, the filling material 50 includes an isolation material. In some embodiments, the filling material 50 includes silicon oxide, silicon nitride, silicon oxynitride, any other suitable material or a combination thereof. In some embodiments, the filling material 50 has a void 50a in the filling material 50, which is lower than an upper surface of the semiconductor substrate 10.

In some embodiments, a protective layer 40 is conformally formed in the deep trench 10c before forming the filling material 50 in the deep trench 10c. In some embodiments, the protective layer 40 is configured to protect the electronic components, such as the CMOS or the MEMS, when subsequent processes (e.g., wet etching processes) are performed. In some embodiments, the protective layer 40 includes oxide, such as fluorosilicate glass (FSG), undoped silicon glass (USG), low-K $SiO_x$, oxide manufactured by high aspect ratio process (HARP) or hard breakdown (HBD) process, TEOS, super undoped silicon glass (SUSG) or a combination thereof.

Figure 2I:
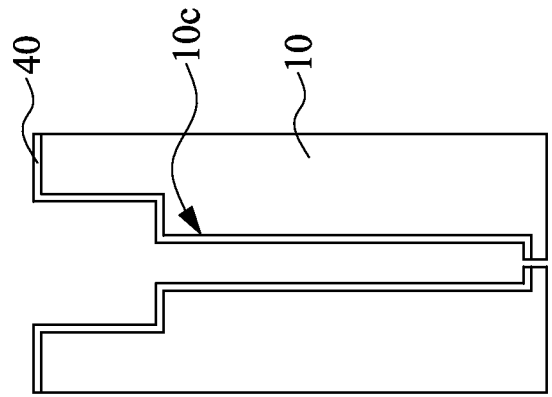
Figure 2H:
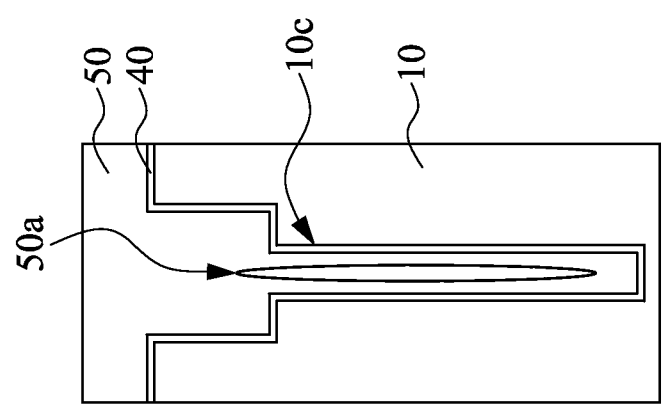
Figure 2G:
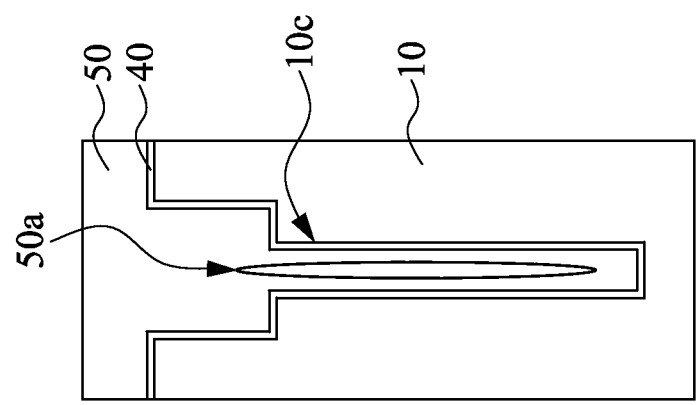

Referring to FIGS. 2F and 2G, a planarization process is performed on the filling material 50 to thin the filling material 50. In some embodiments, the planarization process includes a chemical mechanical polishing (CMP) process, a grinding process, an etching process, any other suitable material removal process or a combination thereof. Since the void 50a is lower than the upper surface of the semiconductor substrate 10, no slit is formed after the planarization process is performed. The process problems caused by the slit 50b of FIG. 1B will not occur accordingly.

In some embodiments, the deep trench 10c with the filling material 50 is configured to separate semiconductor chips of the semiconductor substrate 10. In some embodiments, as shown in FIGS. 2G and 2H, a thinning process is performed on bottom of the semiconductor substrate 10 to reduce a thickness of the semiconductor substrate 10 beneath the deep trench 10c.

In some embodiments, as shown in FIGS. 2H and 2I, the filling material 50 is removed. In some embodiments, the filling material 50 is removed using an etching process, such as dry, wet etching process or a combination thereof. In some embodiments, the filling material 50 is removed using an acid, such as hydrofluoric acid, sulfuric acid, phosphoric acid, any other suitable acid or a combination thereof.

In some embodiments, after the filling material 50 is removed, the semiconductor chips of the semiconductor substrate 10 are separated (split) along the deep trench 10c, as shown in FIGS. 2H and 2I. It is easy to separate the semiconductor chips of the semiconductor substrate 10 due to the thin thickness of the semiconductor substrate 10 near bottom of the deep trench 10c.

The present disclosure also provides another method of forming a deep trench having a wider upper portion to prevent forming a void in a filling material higher than an upper surface of a substrate. FIGS. 3A to 3D are cross-sectional views at various stages of forming a deep trench 10c in a semiconductor substrate 10 in accordance with some embodiments of the present disclosure.

Referring to FIG. 3A, the semiconductor substrate 10 is provided. In some embodiments, the semiconductor substrate 10 includes semiconductor chips. In some embodiments, the semiconductor substrate 10 includes complementary metal oxide semiconductor (CMOS) integrated circuits (ICs), micro-electromechanical systems (MEMS), any other suitable electronic component or a combination thereof. In some embodiments, the semiconductor substrate 10 is a CMOS substrate. In some embodiments, the semiconductor substrate 10 includes an epitaxy layer (not shown) therein. In some embodiments, the electronic components are disposed over the epitaxy layer. In some embodiments, the semiconductor substrate 10 includes a pass layer (not shown) over the semiconductor substrate 10. In some embodiments, the pass layer includes insulating material, such as silicon oxide, silicon nitride, silicon oxynitride or a combination thereof. In some embodiments, the semiconductor substrate 10 includes an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or a combination thereof. In some embodiments, the semiconductor substrate 10 is a bulk silicon substrate.

Next, as shown in FIG. 3A, a mask pattern 25 is formed over a semiconductor substrate 10 to expose a portion of the semiconductor substrate 10. The mask pattern has a first portion 25a adjacent to the portion of the semiconductor substrate 10 and a second portion 25b laterally adjacent to the first portion 25a. The second portion 25b has a thickness t2 greater than a thickness t1 of the first portion 25a. In some embodiments, the mask pattern 25 is formed using a gray tone mask. In some embodiments, the mask pattern 25 includes a hard mask material. In some embodiments, the mask pattern 25 includes an inorganic material. In some embodiments, the mask pattern 25 includes silicon oxide, silicon nitride, silicon oxynitride or a combination thereof. In some embodiments, the mask pattern 25 includes a silicon-containing organic material. In some embodiments, the mask pattern 25 includes an organic material.

Referring to FIGS. 3A and 3B, the exposed portion of the semiconductor substrate 10 is removed according to the mask pattern 25 to form a trench 10a. In some embodiments, the exposed portion of the semiconductor substrate 10 is removed using a dry etching method. In some embodiments, an etching gas of the dry etching method includes $C_xF_yH_z$. In some embodiments, the etching gas of the dry etching method includes $C_4F_6$, $C_4F_8$, $C_5F_8$, $C_2F_4H_2$, $CF_3H$, $CF_2H_2$, any other suitable $C_xF_yH_z$ gas or a combination thereof.

Referring to FIGS. 3B and 3C, the first portion 25a of the mask pattern 25 is removed to expose another portion of the semiconductor substrate 10. In some embodiments, the mask pattern 25 is thinned to completely remove the first portion 25a. In some embodiments, the mask pattern 25 is thinned using a dry etching method. In some embodiments, an etching gas of the dry etching method includes $C_xF_yH_z$. In some embodiments, the etching gas of the dry etching method includes $C_4F_6$, $C_4F_8$, $C_5F_8$, $C_2F_4H_2$, $CF_3H$, $CF_2H_2$, any other suitable $C_xF_yH_z$ gas or a combination thereof. In some embodiments, the trench 10a of FIG. 3B is etched when the mask pattern 25 is thinned, and thus to form a trench 10b with a depth greater than that of the trench 10a.

Referring to FIGS. 3C and 3D, the other portion of the semiconductor substrate 10 is removed and the trench 10b is etched according to the second portion 25b of the mask pattern 25 to form the deep trench 10c. In some embodiments, the deep trench 10c has a depth greater than that of the trench 10b. In some embodiments, the other portion of the semiconductor substrate 10 is removed or the trench 10b is etched using a dry etching method. In some embodiments, an etching gas of the dry etching method includes $C_xF_yH_z$. In some embodiments, the etching gas of the dry etching method includes $C_4F_6$, $C_4F_8$, $C_5F_8$, $C_2F_4H_2$, $CF_3H$, $CF_2H_2$, any other suitable $C_xF_yH_z$ gas or a combination thereof.

In some embodiments, as shown in FIGS. 3D and 2F, after the deep trench 10c is formed, the second portion 25b of the mask pattern 25 is removed, and a filling material 50 is then formed in the deep trench 10c. In some embodiments, as shown in FIGS. 3D and 2F, a protective layer 40 is conformally formed in the deep trench 10c before forming the filling material 50 in the deep trench 10c. In some embodiments, the protective layer 40 is configured to protect the electronic components, such as the CMOS or the MEMS, during subsequent processes (e.g., wet etching processes) are performed. In some embodiments, the protective layer 40 includes oxide, such as fluorosilicate glass (FSG), undoped silicon glass (USG), low-K $SiO_x$, oxide manufactured by high aspect ratio process (HARP) or hard breakdown (HBD) process, TEOS, super undoped silicon glass (SUSG) or a combination thereof.

The present disclosure further provides a deep trench isolation structure including a semiconductor substrate and a filling material. As shown in FIG. 2F, the deep trench isolation structure includes a semiconductor substrate 10 and a filling material 50.

In some embodiments, the semiconductor substrate 10 includes semiconductor chips. In some embodiments, the semiconductor substrate 10 includes complementary metal oxide semiconductor (CMOS) integrated circuits (ICs), micro-electromechanical systems (MEMS), any other suitable electronic component or a combination thereof. In some embodiments, the semiconductor substrate 10 is a CMOS substrate. In some embodiments, the semiconductor substrate 10 includes an epitaxy layer (not shown) therein. In some embodiments, the electronic components are disposed over the epitaxy layer. In some embodiments, the semiconductor substrate 10 includes a pass layer (not shown) over the semiconductor substrate 10. In some embodiments, the pass layer includes insulating material, such as silicon oxide, silicon nitride, silicon oxynitride or a combination thereof. In some embodiments, the semiconductor substrate 10 includes an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or a combination thereof. In some embodiments, the semiconductor substrate 10 is a bulk silicon substrate.

In some embodiments, the semiconductor substrate 10 has a deep trench 10c. The deep trench 10c includes a first portion P1 and a second portion P2 substantially aligned with and over the first portion P1. The term "substantially aligned with" means that a vertical projection of the second portion P2 on the semiconductor substrate 10 is overlapped with a vertical projection of the first portion P1 on the semiconductor substrate 10. In some embodiments, the vertical projection of the first portion P1 on the semiconductor substrate 10 is in the vertical projection of the second portion P2 on the semiconductor substrate 10.

The second portion P2 has a width w2 greater than a width w1 of the first portion P1. In some embodiments, the width w2 of the second portion P2 is greater than or equal to twice the width w1 of the first portion P1. The second portion P2 has a depth d2 greater than the width w1 of the first portion P1. In some embodiments, a ratio of a depth d1 of the first portion P1 to the width w1 of the first portion P1 is in a range of 4 to 10. In some embodiments, a ratio of a depth d2 of the second portion P2 to the width w2 of the second portion P2 is greater than or equal to 0.5, or even greater than or equal to 1.0.

In some embodiments, the filling material 50 has a void 50a in the filling material 50. In some embodiments, the void 50a is lower than an upper surface of the semiconductor substrate 10. In some embodiments, the void 50a is in the first portion P1 of the deep trench 10c. In some embodiments, the void 50a extends from the first portion P1 of the deep trench 10c to the second portion P2 of the deep trench 10c.

In some embodiments, the deep trench isolation structure of FIG. 2F is a chiplet deep trench isolation structure. In some embodiments, as shown in FIGS. 2F to 2I, a planarization process is performed, and bottom of the semiconductor substrate 10 is thinned, and the filling material 50 is removed to separate two neighboring semiconductor chips of the semiconductor substrate 10. Since the void 50a is lower than the upper surface of the semiconductor substrate 10, no slit is formed after the planarization process is performed. The process problems caused by the slit 50b of FIG. 1B will not occur accordingly.

According to some embodiments, a method of forming a deep trench in a semiconductor substrate includes: forming a first mask pattern over the semiconductor substrate, in which the first mask pattern has a first opening exposing a portion of the semiconductor substrate; forming a second mask pattern over the first mask pattern, in which the second mask pattern has a second opening substantially aligned with the first opening to expose the portion of the semiconductor substrate, and the second opening has a width greater than a width of the first opening to further expose a portion of the first mask pattern; and removing the portion of the semiconductor substrate, the portion of first mask pattern and another portion of the semiconductor substrate beneath the portion of the first mask pattern to form the deep trench.

According to some embodiments, a method of forming a deep trench in a semiconductor substrate includes: forming a mask pattern over the semiconductor substrate to expose a portion of the semiconductor substrate, in which the mask pattern has a first portion adjacent to the portion of the semiconductor substrate and a second portion laterally adjacent to the first portion, and the second portion has a thickness greater than a thickness of the first portion; removing the portion of the semiconductor substrate according to the mask pattern to form a trench; removing the first portion of the mask pattern to expose another portion of the semiconductor substrate; and removing the other portion of the semiconductor substrate and etching the trench according to the second portion to form the deep trench.

According to some embodiments, a deep trench isolation structure includes a semiconductor substrate and a filling material. The semiconductor substrate has a deep trench, in which the deep trench includes a first portion and a second portion substantially aligned with and over the first portion, and the second portion has a width and a depth greater than a width of the first portion. The filling material is in the deep trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a deep trench in a semiconductor substrate, the method comprising:
   forming a first mask pattern over the semiconductor substrate, wherein the first mask pattern has a first opening exposing a portion of the semiconductor substrate;
   forming a second mask pattern over the first mask pattern, wherein the second mask pattern has a second opening substantially aligned with the first opening to expose the portion of the semiconductor substrate, and the second opening has a width greater than a width of the first opening to further expose a portion of the first mask pattern;
   removing the portion of the semiconductor substrate, the portion of the first mask pattern, and another portion of the semiconductor substrate beneath the portion of the first mask pattern to form the deep trench; and forming a filling material in the deep trench, the filling material having a void that is lower than an upper surface of the semiconductor substrate.

2. The method of claim 1, wherein the width of the second opening is greater than or equal to twice the width of the first opening.

3. The method of claim 1, wherein removing the portion of the semiconductor substrate, the portion of the first mask pattern and the other portion of the semiconductor substrate beneath the portion of the first mask pattern to form the deep trench comprises:
removing the portion of the semiconductor substrate according to the first mask pattern to form a trench;
removing the portion of the first mask pattern according to the second mask pattern to expose the other portion of the semiconductor substrate and retain another portion of the first mask pattern; and
removing the other portion of the semiconductor substrate and etching the trench according to the other portion of the first mask pattern to form the deep trench.

4. The method of claim 1, further comprising thinning the second mask pattern during removing the portion of the semiconductor substrate.

5. The method of claim 1, wherein the first mask pattern comprises silicon oxide, silicon nitride, silicon oxynitride, or a combination thereof.

6. The method of claim 1, wherein the second mask pattern has a thickness greater than a thickness of the first mask pattern.

7. The method of claim 1, further comprising conformally forming a protective layer in the deep trench before forming the filling material in the deep trench.

8. The method of claim 1, further comprising performing a planarization process on the filling material.

9. The method of claim 1, wherein the first mask pattern comprises an inorganic material.

10. The method of claim 1, wherein the second mask pattern comprises an organic material.

11. The method of claim 3, wherein the deep trench has a depth greater than a depth of the trench.

12. The method of claim 3, wherein the deep trench has a width greater than a width of the trench.

13. The method of claim 8, wherein performing the planarization process on the filling material comprises performing the planarization process on the filling material to thin the filling material.

14. The method of claim 8, wherein performing the planarization process on the filling material comprises performing the planarization process on the filling material to form a flat surface without any slit.

15. The method of claim 8, further comprising performing a thinning process on bottom of the semiconductor substrate to reduce a thickness of the semiconductor substrate beneath the deep trench after performing the planarization process on the filling material.

16. The method of claim 15, further comprising removing the filling material after performing the thinning process on the bottom of the semiconductor substrate.

17. The method of claim 16, further comprising splitting the semiconductor substrate along the deep trench after removing the filling material.

18. The method of claim 1, wherein the semiconductor substrate comprises complementary metal oxide semiconductor (CMOS) integrated circuits (ICs), micro-electromechanical systems (MEMS) or a combination thereof.

19. The method of claim 1, wherein the deep trench is an isolation structure.

20. The method of claim 1, wherein the filling material includes an isolation material.

* * * * *